(12) United States Patent
Lin et al.

(10) Patent No.: US 7,701,305 B2
(45) Date of Patent: Apr. 20, 2010

(54) FREQUENCY JITTERING CONTROL FOR VARYING THE SWITCHING FREQUENCY OF A POWER SUPPLY

(75) Inventors: Tzu-Chen Lin, Taipei (TW); Pei-Lun Huang, Longtan Shiang (TW); Hung-Che Chou, Jiadung Township, Pingtung County (TW)

(73) Assignee: Richtek Technology Corp., Hsinchu (TW)

( * ) Notice: Subject to any disclaimer, the term of this patent is extended or adjusted under 35 U.S.C. 154(b) by 70 days.

(21) Appl. No.: 11/822,575

(22) Filed: Jul. 9, 2007

(65) Prior Publication Data

US 2008/0279324 A1 Nov. 13, 2008

(30) Foreign Application Priority Data

May 11, 2007 (TW) .............................. 96116931 A

(51) Int. Cl.
*H03K 3/02* (2006.01)
*H03K 7/00* (2006.01)

(52) U.S. Cl. ........................ 331/143; 331/153; 323/284; 363/21.11; 713/501

(58) Field of Classification Search ................. 331/143, 331/153; 323/284, 281–283; 363/21.11, 363/19, 21.18; 713/501, 300, 320, 322, 500, 713/502, 503
See application file for complete search history.

(56) References Cited

U.S. PATENT DOCUMENTS

| | | | | |
|---|---|---|---|---|
| 6,107,851 A | * | 8/2000 | Balakirshnan et al. | 327/172 |
| 6,249,876 B1 | * | 6/2001 | Balakrishnan et al. | 713/501 |
| 7,026,851 B2 | * | 4/2006 | Yang et al. | 327/172 |
| 7,184,283 B2 | * | 2/2007 | Yang et al. | 363/41 |
| 7,358,821 B2 | * | 4/2008 | Chia | 331/78 |
| 7,577,002 B2 | * | 8/2009 | Yang | 363/1 |
| 2006/0181346 A1 | * | 8/2006 | Nguyen | 330/251 |
| 2007/0103137 A1 | * | 5/2007 | Yang | 323/284 |
| 2007/0132440 A1 | * | 6/2007 | Yang | 323/304 |
| 2007/0133234 A1 | * | 6/2007 | Huynh et al. | 363/20 |

* cited by examiner

*Primary Examiner*—Robert Pascal
*Assistant Examiner*—Levi Gannon
(74) *Attorney, Agent, or Firm*—Rosenberg, Klein & Lee

(57) ABSTRACT

A frequency jittering circuit modulates a hysteretic band of an oscillator such that the clock generated by the oscillator has a jitter frequency, and thus a switching mode power supply operative on the clock will have a jittering switching frequency.

24 Claims, 5 Drawing Sheets

FREQUENCY JITTERING CONTROL FOR VARYING THE SWITCHING FREQUENCY OF A POWER SUPPLY

FIELD OF THE INVENTION

The present invention generally relates to a switching mode power supply and, more particularly, to a frequency jittering circuit and method for varying the switching frequency of a power supply.

BACKGROUND OF THE INVENTION

Most switching mode power supplies operate at a fixed and fast switching frequency. Unfortunately, a strong noise would be generated at such switching frequency and its relative harmonic, thereby inducing loud electromagnetic interference (EMI). Jittering or dithering switching frequency can distribute the noise's energy to a broad band, and thus depresses the noise and improves the performance in conduction of EMI. As is well known in the art, the switching frequency of a switching mode power supply depends on the clock frequency of the oscillator in the power supply. For further detail, FIG. 1 shows a conventional oscillator 100, in which a comparator 102 will trigger a comparison signal COMP1 to a set input S of a flip-flop 110 when the voltage Vosc on the capacitor C-osc is lower than a lower limit VREF1 of a hysteretic band, causing the output Q of the flip-flop 110 to be high, and thereby turning off a switch S4 for a current source 108 to stop discharging the capacitor C_osc, and turning on a switch S3 for a current source 106 to charge the capacitor C_osc. When the voltage Vosc increases to touch an upper limit VREF2 of the hysteretic band, a comparator 104 triggers a comparison signal COMP2 to a reset input R of the flip-flop 110, causing the output Q of the flip-flop 110 to be low, and thereby turning off the switch S3 for current source 106 to stop charging the capacitor C_osc, and turning on the switch S4 for the current source 108 to discharge the capacitor C_osc. A one shot circuit 112 generates a clock CLK according to the output Q of the flip-flop 110. As shown in the oscillator 100 of FIG. 1, the frequency of the clock CLK is determined by the charging current IREF 1, the discharging current IREF2, the capacitance C_osc and the hysteretic band corresponding to the lower limit VREF1 and the upper limit VREF2. U.S. Pat. No. 6,249,876 to Balakrishnan et al. disclosed a frequency jittering control for varying the switching frequency of a power supply by adjusting the charging and discharging currents in the oscillator circuit of the power supply, and thus reduces the EMI emission. However, this art requires a huge capacitor to be charged and discharged, which is disadvantageous to cost reduction and chip circuit integration.

Therefore, it is desired a smaller and cost-effective frequency jittering circuit for varying the switching frequency of a power supply.

SUMMARY OF THE INVENTION

An object of the present invention is to provide a frequency jittering circuit and method for varying the switching frequency of a power supply.

In a frequency jittering circuit according to the present invention, the hysteretic band of an oscillator is varied to provide a clock having a jitter frequency, so as to obtain a jittering switching frequency when a switching mode power supply operates on the clock.

In one embodiment, a triangle wave is provided such that the upper limit of the hysteretic band varies with time, and when the upper limit of the hysteretic band increases or decreases, the clock frequency decreases or increases accordingly.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
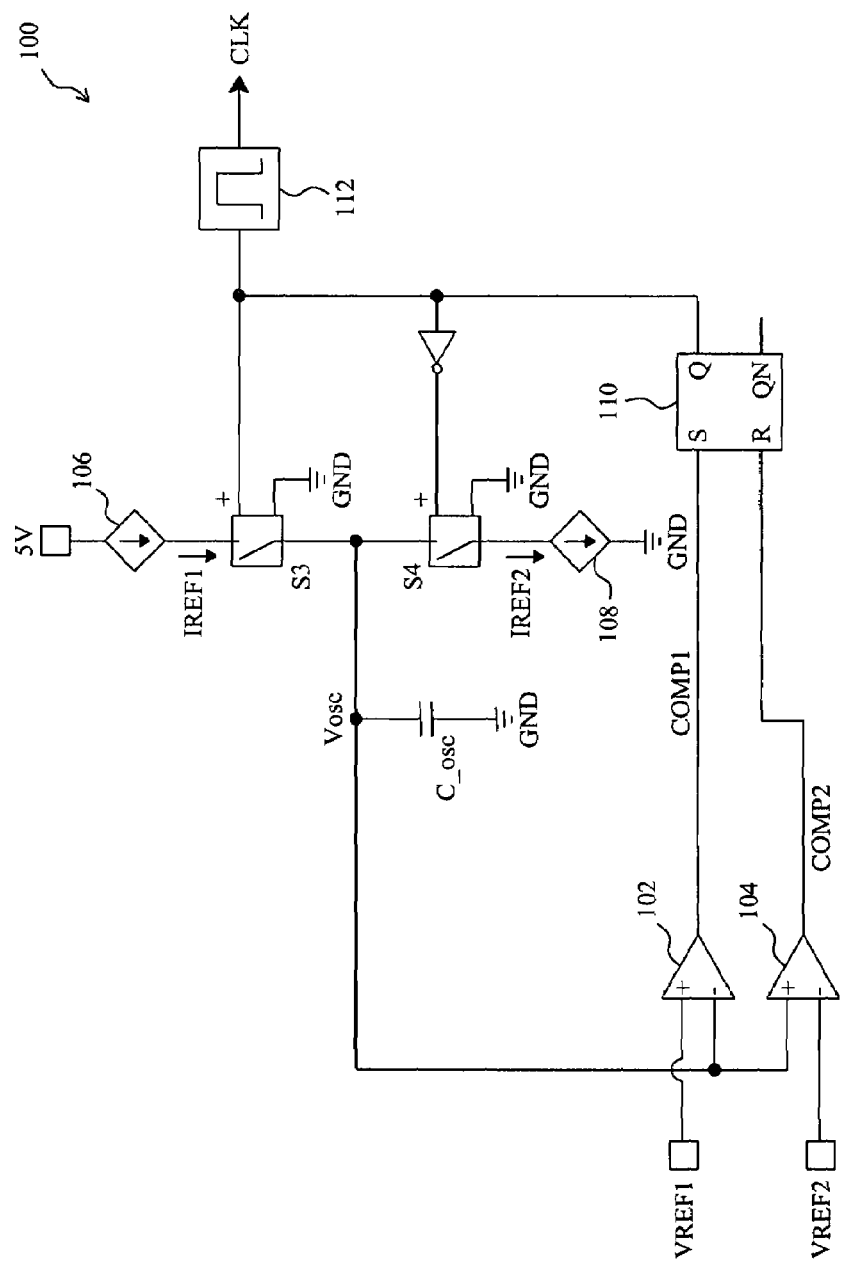
FIG. 1 is a conventional oscillator circuit.
Figure 2:
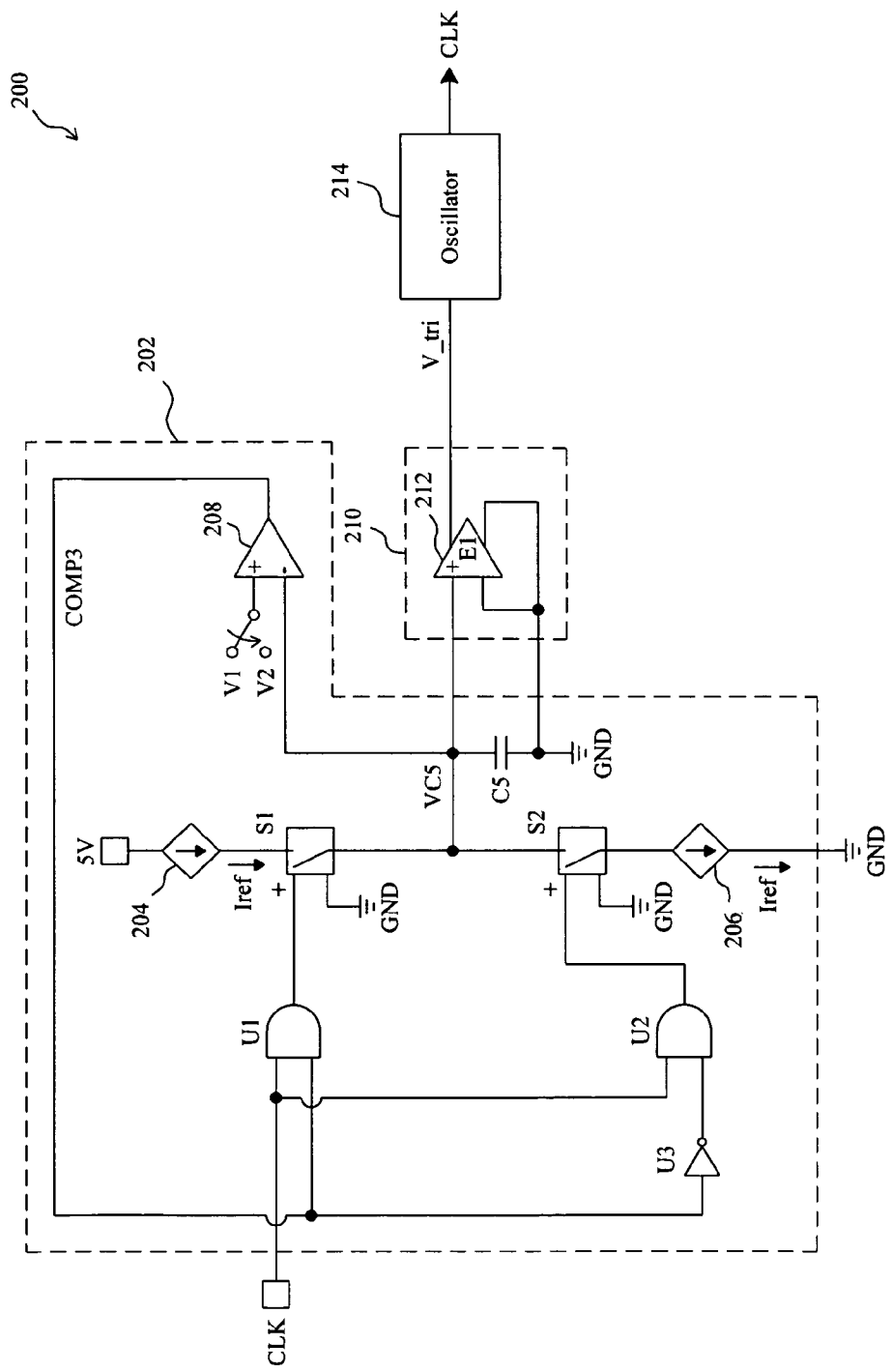
FIG. 2 is an embodiment according to the present invention.
Figure 3:
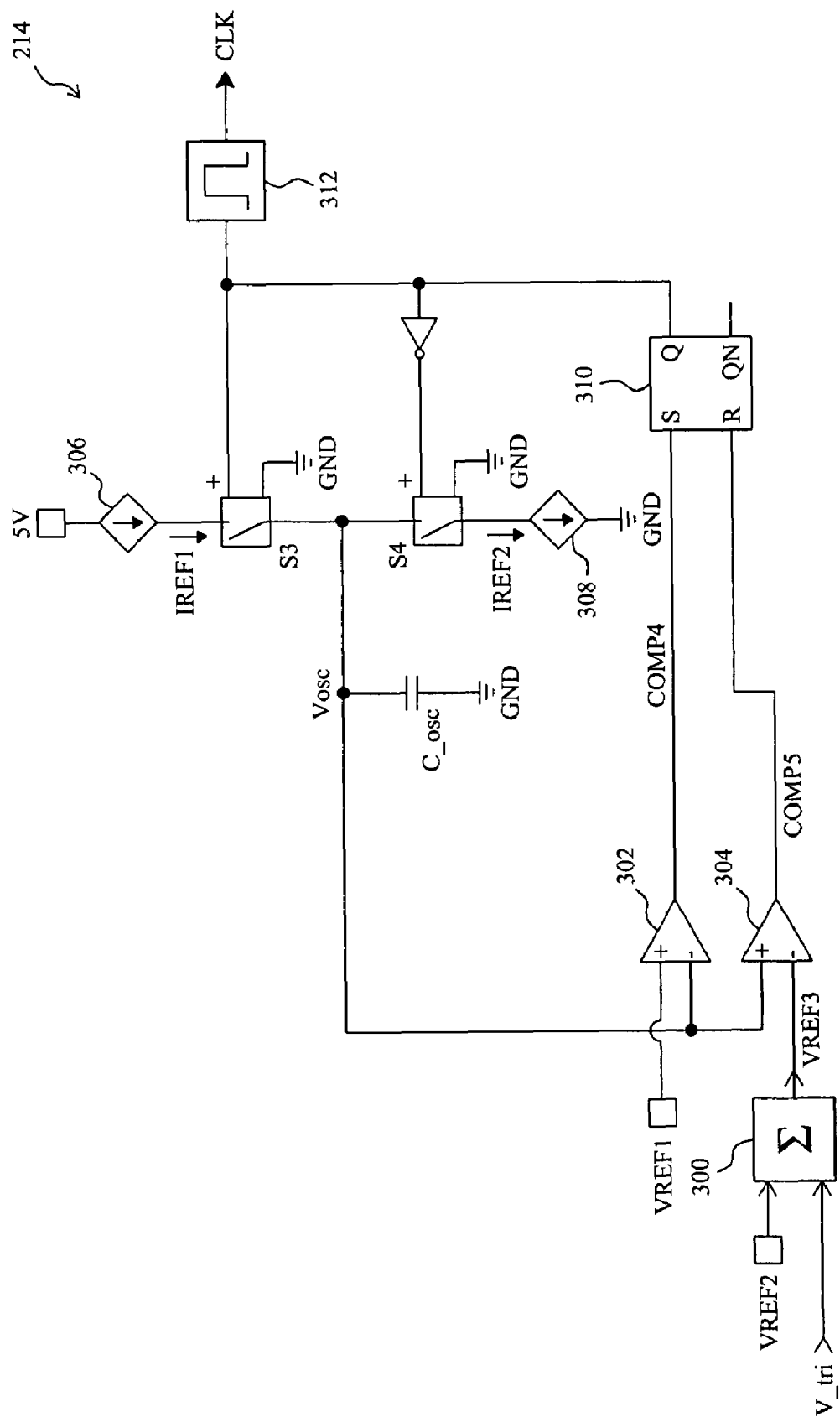
FIG. 3 is an embodiment for the oscillator shown in FIG. 2.

As an embodiment according to the present invention shown in FIG. 2, a frequency jittering circuit 200 has a hysteretic band modulator 202 to modulate the hysteretic band for generating a clock for a switching mode power supply. The hysteretic band modulator 202 generates a low-frequency signal VC5 under clocking of a clock CLK, and a gain circuit 210 includes an amplifier 212 of gain E1 to amplify the low-frequency signal VC5 to thereby generate a modifying signal V_tri for an oscillator 214. The modifying signal V_tri modifies the hysteretic band of the oscillator 214, and thus the hysteretic band varies with time. In the hysteretic band modulator 202, a current source 204 is connected to a capacitor C5 via a switch S1, a current source 206 is connected to the capacitor C5 via a switch S2, and a voltage comparator 208 detects the low-frequency signal VC5 to generate a comparison signal COMP3. The comparison signal COMP3 and the clock CLK are used to switch the switches S1 and S2 such that the current sources 204 and 206 charge and discharge the capacitor C5, respectively, so as to produce the low-frequency signal VC5. FIG. 3 is an embodiment for the oscillator 214 shown in FIG. 2, in which an adder 300 combines a signal VREF2 and the modifying signal V_tri to generate an upper limit VREF3 for the hysteretic band. When the voltage Vosc on the capacitor C_osc is lower than the lower limit VREF1 of the hysteretic band, a comparator 302 triggers a comparison signal COMP4 to a set input S of a flip-flop 310, and when the voltage Vosc is higher than the upper limit VREF3 of the hysteretic band, a comparator 304 triggers a comparison signal COMP5 to a reset input R of the flip-flop 310. Therefore, in accordance with the comparison signals CMOP4 and COMP5, the flip-flop 310 switches the switches S3 and S4 by its output Q such that the capacitor C_osc is charged and discharged by current sources 306 and 308, respectively. A one shot circuit 312 generates the clock CLK in accordance with the output Q of the flip-flop 310. The clock CLK is provided for a switching mode power supply, and thus the jittering frequency of the clock CLK varies the switching frequency of the power supply.

Figure 4:
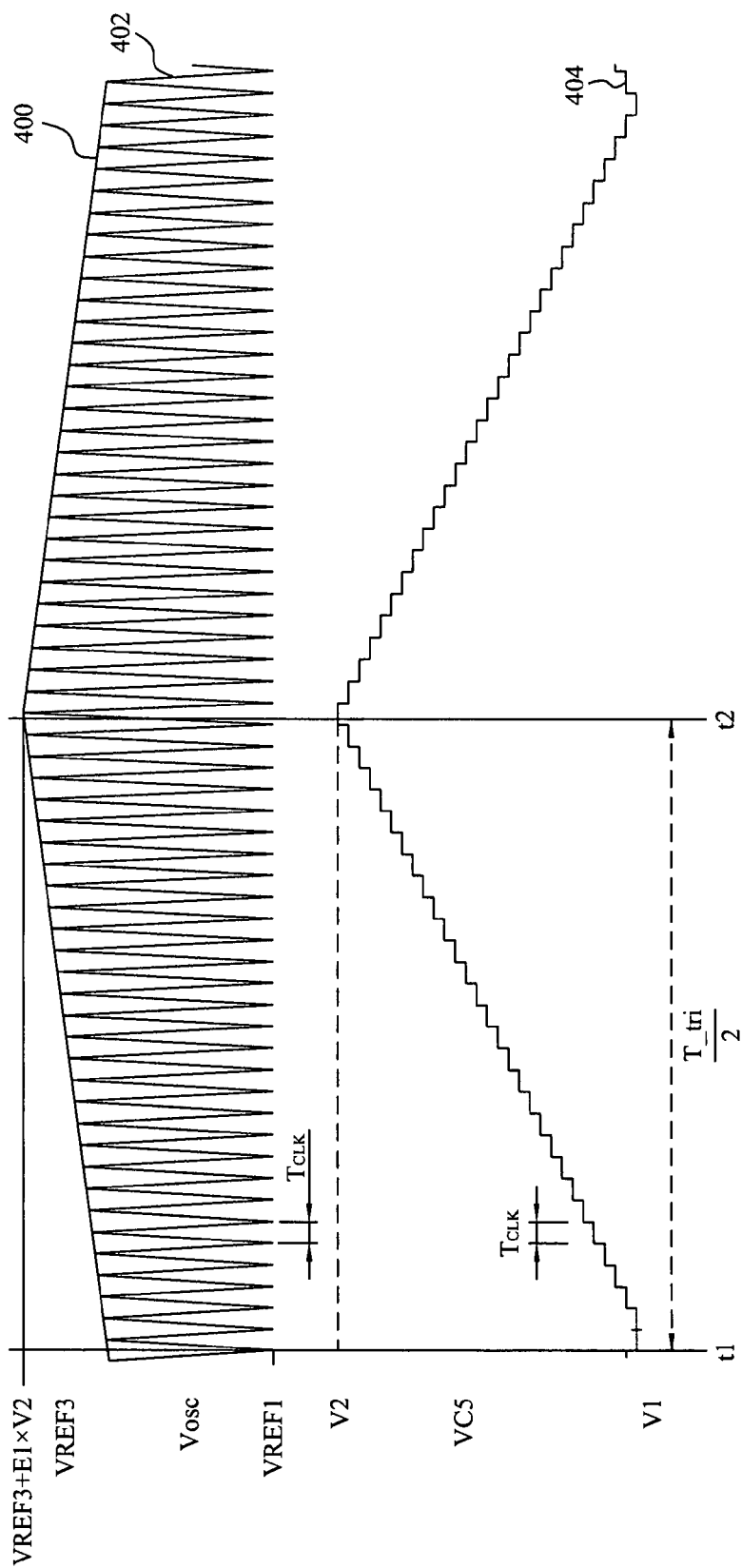
FIG. 4 is a waveform diagram showing various signals in the circuits of FIGS. 2 and 3.

FIG. 4 is a waveform diagram showing various signals in the circuits of FIGS. 2 and 3, in which waveform 400 represents the upper limit VREF3 of the hysteretic band, waveform 402 represents the voltage Vosc, and waveform 404 represents the low-frequency signal VC5. At time t1, the low-frequency signal VC5 equals to V1, and thus the output COMP3 of the comparator 208 is high, which enables a logic unit U1 and disables a logic unit U2; meanwhile, the non-inverting input of the comparator 208 is switched to a voltage V2. During the logic unit U2 is disabled, the switch S2 remains off, and the switch S1 is switched by the clock CLK. When the clock CLK is at high level, the switch S1 is on such that the current source 204 provides a current Iref to charge the capacitor C5. When the clock CLK is at low level, the switch S1 is off so as to stop charging the capacitor C5; as a result, the low-frequency signal VC5 increases in steps, as shown by the waveform 404 in FIG. 4. During each clock period $T_{CLK}$, the low-frequency signal VC5 is increased by a difference $$\Delta VC5 = \Delta t \times Iref/C5, \quad [\text{EQ-1}]$$

where $\Delta t$ is the duty cycle of the clock period $T_{CLK}$. Once the low-frequency signal VC5 reaches V2, as shown at time t2, the output COMP3 of the comparator 208 becomes low, and enables the logic unit U2 and disables the logic unit U1; meanwhile, the non-inverting input of the comparator 208 is switched back to the voltage V1. During the logic unit U1 is disabled, the switch S1 remains off, and the switch S2 is switched by the clock CLK. When the clock CLK is at high level, the switch S2 is on such that the current source 206 discharges the capacitor C5, and when the clock CLK is at a low level, the switch S2 is off so as to stop discharging the capacitor C5. As a result, the low-frequency signal VC5 decreases in steps. During each clock period $T_{CLK}$, the low-frequency signal VC5 is decreased by a difference $\Delta VC5$, as shown in the equation EQ-1. Because the duty cycle $\Delta t$ of the clock period $T_{CLK}$ is less than the clock period $T_{CLK}$, the low-frequency signal VC5 has a much lower frequency than that of the voltage Vosc in the oscillator 214, as shown by the waveform 404 in FIG. 4. The period of the low-frequency signal VC5 can be derived from the equation EQ-1 as $$T\_tri = [(V2 - V1) \times C5/(\Delta t \times Iref)] \times T_{CLK} \times 2. \quad [\text{EQ-2}]$$

In this embodiment, the low-frequency signal VC5 is a triangle wave, as shown by the waveform 404 in FIG. 4. The modifying signal V_tri is generated by amplifying the low-frequency signal VC5 by E1 times by the amplifier 212; therefore, the modifying signal V_tri is also a triangle wave. Additionally, in this embodiment, the capacitor C5 is charged and discharged in steps so the capacitance C5 needs not be large.

Referring to FIGS. 3 and 4. Since the signal VREF2 has a fixed value and is combined with the modifying signal V_tri by the adder 300 to produce the upper limit VREF3 of the hysteretic band, the upper limit VREF3 is also a triangle wave, as shown by the waveform 400 in FIG. 4. In the oscillator 214 of FIG. 3, the currents IREF1 and IREF2 provided by the current sources 306 and 308 will determine the increasing and decreasing slopes of the voltage Vosc. When the voltage Vosc is lower than the lower limit VREF1 of the hysteretic band, the output COMP4 of the comparator 302 signals the flip-flop 310 to turn off the switch 54 to stop discharging the capacitor C5 by the current IREF2, and turn on the switch S3 to charge the capacitor C5 by the current IREF1, thereby causing the voltage Vosc to increase. When the voltage Vosc is higher than the upper limit VREF3 of the hysteretic band, the output COMP5 of the comparator 304 signals the flip-flop 310 to turn off the switch S3 to stop charging the capacitor C5 by the current IREF1, and turn on the switch S4 to discharge the capacitor C5 by the current IREF2, thereby causing the voltage Vosc to decrease. As shown by the waveforms 400 and 402 in FIG. 4, when the upper limit VREF3 of the hysteretic band increases, the voltage Vosc will increase, and on the contrary, the voltage Vosc decreases. Referring to FIG. 3, the period of the voltage Vosc is equal to the period $T_{CLK}$ of the clock CLK, and thus the period $T_{CLK}$ of the clock CLK will increase or decrease in accordance with the increase or decrease of the upper limit VREF3 of the hysteretic band. In other words, the clock CLK will have a jitter frequency, thereby obtaining a jittering switching frequency for the power supply utilizing the clock CLK. The period of the clock CLK can be derived from the circuit of FIG. 3 as $$T_{CLK} = \frac{Cosc \times (VREF3(t) - VREF1)}{IREF1}\left(1 + \frac{IREF1}{IREF2}\right) \quad [\text{EQ-3}]$$

In the above embodiment, although an adjustment on the upper limit of the hysteretic band is used for illustration, in other embodiments, an adjustment on the lower limit of the hysteretic band can be used alternatively, in order to modulate the hysteretic band.

Figure 5:
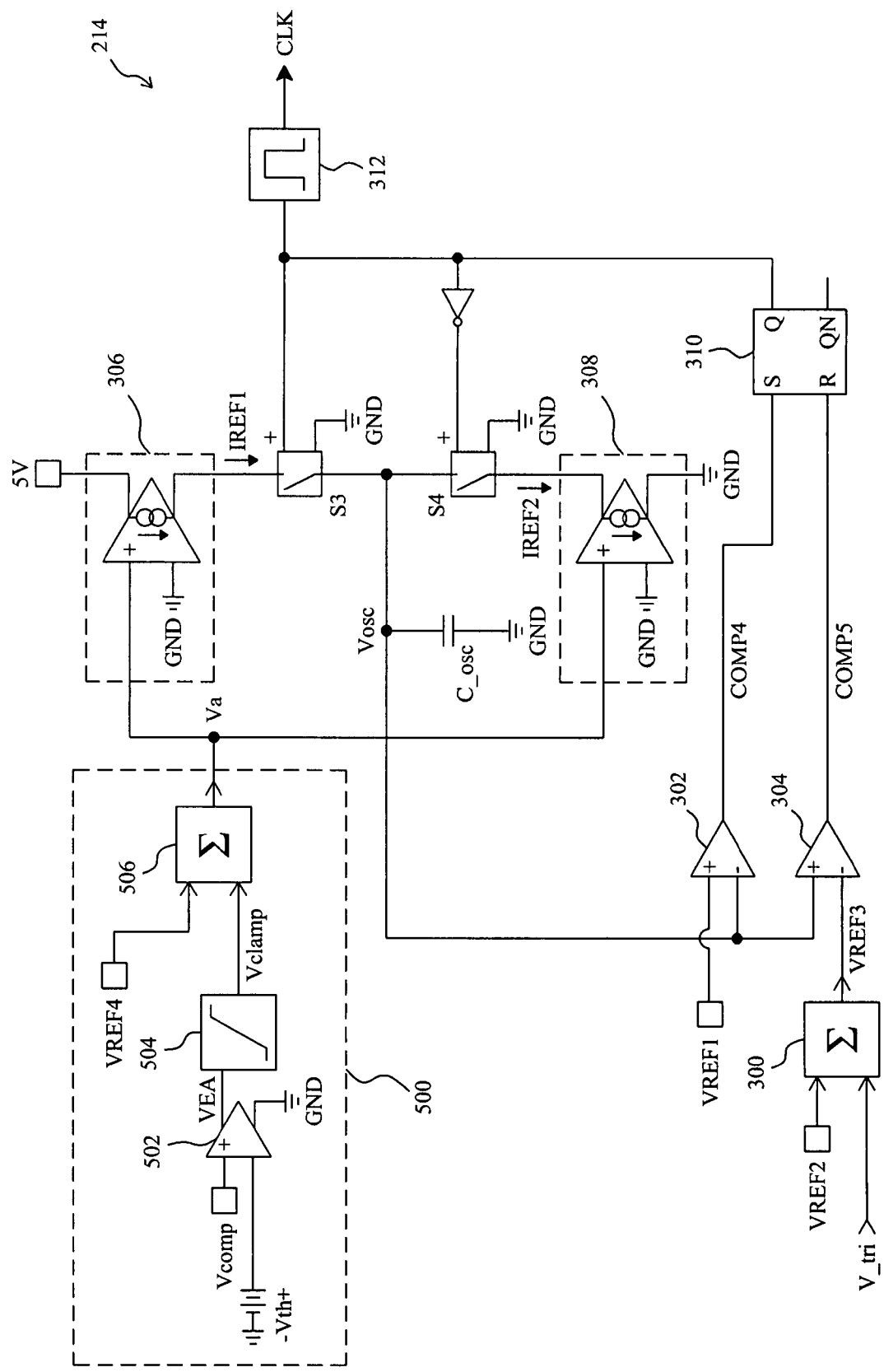
FIG. 5 is another embodiment for the oscillator shown in FIG. 2.

FIG. 5 is another embodiment for the oscillator 214 shown in FIG. 2, which employs voltage-controlled current sources 306 and 308 and further includes a current modifying circuit 500 to control the voltage-controlled current sources 306 and 308, in addition to the adder 300, comparators 302 and 304, flip-flop 310, and one shot circuit 312. The current modifying circuit 500 has an error amplifier 502 for generating an error signal VEA depending on the difference between a reference voltage Vth and a feedback signal Vcomp proportional to the output voltage of the power supply, a clamp circuit 504 for clamping the maximum and minimum values of the error signal VEA to generate a clamped signal Vclamp, and an adder 506 for combining the clamped signal Vclamp and a reference signal VREF4 to generate a current modifying signal Va for the voltage-controlled current sources 306 and 308 to modify the charging and discharging currents IREF1 and IREF2. In this embodiment, when the currents IREF1 and IREF2 decrease such that the switching frequency of the power supply is lower than 20 KHz, there will be generated audible noise. However, the noise can also be fuzzed by the varied hysteretic band in a fixed range.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A frequency jittering circuit for varying the switching frequency of a power supply, comprising:
    an oscillator for providing a clock generated based on a hysteretic band for the power supply operative thereon; and
    a hysteretic band modulator for providing a modulating signal to modulate the hysteretic band such that the clock has a jitter frequency, wherein the modulating signal is responsive to the clock.

2. The frequency jittering circuit of claim 1, wherein the oscillator comprises:
    a charger circuit to be charged and discharged for providing a voltage;

a first comparator for comparing the voltage with an upper limit of the hysteretic band to thereby determine a first comparison signal; and a second comparator for comparing the voltage with a lower limit of the hysteretic band to thereby determine a second comparison signal;

whereby the first and second comparison signals are used to generate the clock.

3. The frequency jittering circuit of claim 2, wherein the upper limit of the hysteretic band varies with the modulating signal.

4. The frequency jittering circuit of claim 3, wherein the oscillator further comprises an adder for combining the modulating signal with a reference signal to thereby determine the upper limit of the hysteretic band.

5. The frequency jittering circuit of claim 4, wherein the modulating signal is a triangle wave.

6. The frequency jittering circuit of claim 3, wherein the upper limit is varied in such a manner that once it increases to a first threshold, it will start to decrease to a second threshold.

7. The frequency jittering circuit of claim 6, wherein the frequency of the clock decreases as the upper limit of the hysteretic band increases, and increases as the upper limit of the hysteretic band decreases.

8. The frequency jittering circuit of claim 6, wherein the upper limit of the hysteretic band increases or decreases by a difference in steps in each cycle of the clock.

9. The frequency jittering circuit of claim 8, wherein the difference is related to a duty cycle of the clock.

10. The frequency jittering circuit of claim 2, wherein to oscillator further comprises:
    a flip-flop for controlling the charger circuit to be charged and discharged in response to the first and second comparison signals; and
    a one shot circuit for generating the clock in accordance with an output of the flip-flop.

11. The frequency jittering circuit of claim 2, wherein the oscillator further comprises a current modifying circuit for controlling the currents to charge and discharge the charger circuit.

12. The frequency jittering circuit of claim 11, wherein the current modifying circuit comprises:
    an error amplifier for generating an error signal depending on the difference between a first reference signal and a feedback signal proportional to an output power of the power supply;
    a clamp circuit for clamping the maximum and minimum values of the error signal to thereby generate a clamped signal; and
    an adder for combing to clamped signal with a second reference signal to generate a current modifying signal to control the currents to charge and discharge the charger circuit.

13. The frequency jittering circuit of claim 1, wherein the hysteretic band modulator comprises:
    a capacitor;
    a first current source for determining a charging current;
    a first switch connected between the capacitor and the first current source;
    a second current source for determining a discharging current; and
    a second switch connected between the capacitor and the second current source;
    whereby the first and second switches are switched to charge and discharge the capacitor to thereby generate a low-frequency signal to determine the modulating signal.

14. The frequency jittering circuit of claim 13, wherein the clock switches the first switch once the low-frequency signal is lower than a first threshold, and switches the second switch after the low-frequency signal increases to be higher than a second threshold.

15. The frequency jittering circuit of claim 13, wherein the hysteretic band modulator further comprises a gain circuit for amplifying the low-frequency signal to generate the modulating signal.

16. The frequency jittering circuit of claim 13, wherein the low-frequency signal is increased or decreased by a difference in steps in each period of the clock.

17. The frequency jittering circuit of claim 16, wherein the difference is related to a duty cycle of the clock.

18. The frequency jittering circuit of claim 13, wherein the low-frequency signal is a triangle wave.

19. A frequency jittering method for varying the switching frequency of a power supply operative on a clock provided by an oscillator, comprising the steps of:
    modulating a hysteretic band of the oscillator according to a modulating signal;
    generating the clock based on the hysteretic band such that the clock has a jitter frequency wherein the modulating signal is responsive to the clock.

20. The frequency jittering method of claim 19, wherein the step of modulating a hysteretic band of the oscillator comprises the steps of:
    providing a low-frequency signal; and
    varying an upper limit or a lower limit of the hysteretic band by the low-frequency signal.

21. The frequency jittering method of claim 20, wherein the step of providing a low-frequency signal comprises the step of charging and discharging a capacitor for generating the low-frequency signal.

22. The frequency jittering method of claim 21, wherein the step of charging and discharging a capacitor for generate the low-frequency signal comprises the steps of:
    controlling the capacitor to be charged in steps by the clock once the low-frequency signal is lower than a first threshold and until the low-frequency signal increases to be higher than a second threshold; and
    controlling the capacitor to be discharged in steps by the clock after the low-frequency signal is higher than the second threshold and until the low-frequency signal decreases to be lower than the first threshold.

23. The frequency jittering method of claim 20, wherein the low-frequency signal is a triangle wave.

24. The frequency jittering method of claim 20, further comprising the step of amplifying the low-frequency signal for generating a modulating signal to modulate the upper limit or lower limit of the hysteretic band.

* * * * *